US009129882B2

(12) United States Patent
Jeon et al.

(10) Patent No.: US 9,129,882 B2
(45) Date of Patent: Sep. 8, 2015

(54) METHOD OF FABRICATING GRAPHENE NANO DEVICE

(71) Applicant: Electronics and Telecommunications Research Institute, Daejeon (KR)

(72) Inventors: Eun Kyoung Jeon, Gwangju (KR); Hyun Seo Kang, Gwangju (KR); Kwon-Seob Lim, Gwangju (KR); Hyoung Jun Park, Gwangju (KR); Keo-Sik Kim, Gwangju (KR); Jeong Eun Kim, Gwangju (KR); Young Sun Kim, Gwangju (KR); Young Soon Heo, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 14/500,764

(22) Filed: Sep. 29, 2014

(65) Prior Publication Data

US 2015/0214305 A1    Jul. 30, 2015

(30) Foreign Application Priority Data

Jan. 28, 2014    (KR) .......................... 10-2014-0010209

(51) Int. Cl.
  *H01L 21/44* (2006.01)
  *H01L 29/16* (2006.01)
  *H01L 21/283* (2006.01)
  *H01L 21/306* (2006.01)
  *H01L 21/308* (2006.01)

(52) U.S. Cl.
  CPC .......... *H01L 29/1606* (2013.01); *H01L 21/283* (2013.01); *H01L 21/3081* (2013.01); *H01L 21/3086* (2013.01); *H01L 21/30604* (2013.01)

(58) Field of Classification Search
  CPC ..................... H01L 29/1606; H01L 29/66015; H01L 2924/13088
  See application file for complete search history.

(56) References Cited

U.S. PATENT DOCUMENTS

| 8,487,356 | B2 | 7/2013 | Heo et al. | |
|---|---|---|---|---|
| 2009/0324897 | A1* | 12/2009 | Choi et al. | ................. 428/195.1 |
| 2010/0081286 | A1 | 4/2010 | Kim et al. | |
| 2011/0143034 | A1 | 6/2011 | Ahn et al. | |
| 2012/0256167 | A1* | 10/2012 | Heo et al. | ......................... 257/27 |
| 2013/0193411 | A1* | 8/2013 | Lee et al. | ......................... 257/29 |
| 2014/0062454 | A1* | 3/2014 | Jeon et al. | ..................... 324/71.1 |

FOREIGN PATENT DOCUMENTS

| KR | 10-2010-0031962 A | 3/2010 |
|---|---|---|
| KR | 10-2011-0041791 A | 4/2011 |
| KR | 10-1105249 B1 | 1/2012 |
| KR | 10-1211850 B1 | 12/2012 |
| KR | 10-1273695 B1 | 6/2013 |
| KR | 10-1324104 B1 | 10/2013 |
| WO | WO 2013-035900 A1 | 3/2013 |

* cited by examiner

*Primary Examiner* — Daniel Whalen
(74) *Attorney, Agent, or Firm* — Rabin & Berdo, P.C.

(57) ABSTRACT

Provided is a method of fabricating a graphene nano device. The method includes forming a first metal mask pattern on a substrate on which a graphene layer is formed, and forming a graphene pattern by performing an etching process on the graphene layer using the first metal mask pattern as an etching mask. The forming of the first metal mask pattern includes forming a first adhesive layer on the graphene layer, disposing the first metal mask pattern prepared in advance on the first adhesive layer, and heating the first adhesive layer to attach the first metal mask pattern on the substrate.

11 Claims, 9 Drawing Sheets

METHOD OF FABRICATING GRAPHENE NANO DEVICE

CROSS-REFERENCE TO RELATED APPLICATIONS

This U.S. non-provisional patent application claims priority under 35 U.S.C. §119 to Korean Patent Application No. 10-2014-0010209, filed on Jan. 28, 2014, the entire contents of which are hereby incorporated by reference.

BACKGROUND

The present disclosure herein relates to a method of fabricating a graphene nano device, and more particularly, to a method of fabricating a graphene nano device including a graphene pattern and a metal electrode pattern.

Graphene is a material having a two-dimensional planar structure in which carbon atoms are connected through $sp^2$ bonding into a hexagonal honey comb shape. Since graphene has high electron mobility, high light transmittance, and good thermal conductivity, the graphene may be applied in various industry fields such as semiconductor, energy, display, etc.

Methods for forming graphene includes a chemical vapor deposition method, a method of attaching graphite using a sticky tape and then detaching physically, and a method of dispersing graphite oxide and then reducing. To utilize the graphene in a transistor or a biosensor, graphene is transferred onto a substrate (for example, a silicon substrate), and a graphene pattern and a metal pattern are formed.

The forming method of the graphene pattern includes a method of forming a carbon-based layer and etching, a graphene pattern forming method using an imprint technology, a graphene pattern forming method using femtosecond laser, a pattern forming method using a block copolymer, and a graphene pattern forming method using a polymer.

Among the methods, the pattern forming method using a polymer includes coating a photoresist on the surface of the graphene on a substrate, irradiating ultraviolet (UV) or electron beam to form a desired photoresist pattern, and performing an etching process using the photoresist pattern and an etching mask. The etching process utilizes an oxygen or argon plasma apparatus or an ICP apparatus. However, the photoresist may be hardened, or the photoresist may remain on the surface of the graphene according to this method. In addition, since the forming of a metal pattern also is performed through a photolithography process using photoresist, the photoresist may remain on the metal pattern during manufacturing a transistor, thereby decreasing electrical conductivity or thermal conductivity and emerging diverse Dirac points.

SUMMARY

The present disclosure provides a method of fabricating a graphene nano device having improved electrical properties.

Embodiments of the inventive concept provide methods of fabricating a graphene nano device including forming a first metal mask pattern on a substrate on which a graphene layer is formed, and forming a graphene pattern by performing an etching process on the graphene layer using the first metal mask pattern as an etching mask. The forming of the first metal mask pattern includes forming a first adhesive layer on the graphene layer, disposing the first metal mask pattern prepared in advance on the first adhesive layer and heating the first adhesive layer to attach the first metal mask pattern on the substrate.

In some embodiments, forming a first membrane mask pattern on the graphene pattern, and performing an etching process on the grapheme pattern using the first membrane mask pattern as an etching mask to form a micro graphene pattern may be further included.

In other embodiments, the forming of the first membrane mask pattern may include forming a second adhesive layer on the graphene pattern, disposing the first membrane mask pattern prepared in advance on the second adhesive layer, and heating the second adhesive layer to attach the first membrane mask pattern on the substrate.

In still other embodiments, the first membrane mask pattern may include a first opening defined by an inner wall of the first membrane mask pattern, and the first opening may expose a portion of the graphene pattern.

In even other embodiments, the first membrane mask pattern may include a body part and a membrane part extended from an inner wall of the body part, and a portion of the first opening may be defined by a side wall of the membrane part.

In yet other embodiments, a thickness of the membrane part may be smaller than a thickness of the body part.

In further embodiments, the first membrane mask pattern may include at least one among a silicon oxide layer, a silicon nitride layer and a silicon oxynitride layer.

In still further embodiments, a portion of the substrate may be exposed by the etching process, and a forming process of a metal electrode pattern on the exposed substrate may be further included. The forming of the metal mask pattern on the substrate may include forming a second metal mask pattern on the substrate, depositing a metal layer on the substrate on which the second metal mask pattern is formed, and removing the second metal mask pattern after depositing the metal layer.

In even further embodiments, the forming of the second metal mask pattern may include forming a third adhesive layer on the graphene pattern, disposing the second metal mask pattern prepared in advance on the third adhesive layer, and heating the third adhesive layer to attach the second metal mask pattern on the substrate.

In yet further embodiments, a portion of the substrate may be exposed by the etching process, and a forming process of a micro metal electrode pattern on the exposed substrate may be further included. The forming of the micro metal electrode pattern may include forming a second membrane mask pattern on the substrate, depositing a metal layer on the substrate on which the second membrane mask pattern is formed, and removing the second membrane mask pattern after depositing the metal layer.

In much further embodiments, separating the first metal mask pattern from the substrate after forming the graphene pattern may be further included, and the first metal mask pattern may be separated from the substrate by removing the first adhesive layer using an organic solvent.

According to the inventive concept, a metal mask pattern prepared in advance may be formed on a substrate on which a graphene layer is formed, and an etching process may be performed using the metal mask pattern as an etching mask to form a graphene pattern. Thus, the contamination of the surface of the graphene pattern may be decreased when compared to a method using a photoresist mask pattern. In addition, through performing the patterning process using a membrane mask pattern formed as a nitride layer, more accurate micro graphene pattern may be formed. Accordingly, a graphene nano device having improved electrical properties may be provided.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the reference numerals and description, serve to explain principles of the inventive concept. In the drawings:

FIGS. 2A to 9A are plan views for explaining a method of fabricating a graphene nano device according to an embodiment of the inventive concept.

DETAILED DESCRIPTION OF THE EMBODIMENTS

Figure 1:
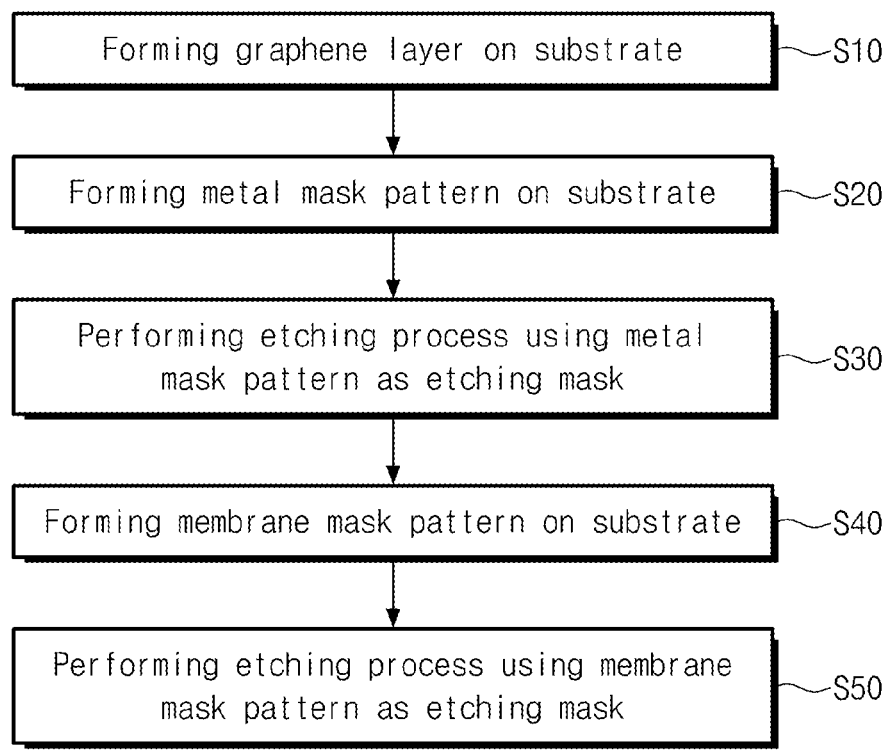
FIG. 1 is a flowchart for explaining a method of fabricating a graphene nano device according to an embodiment of the inventive concept.

Exemplary embodiments of the inventive concept will be described below in more detail with reference to the accompanying drawings to sufficiently understand the constitution and effects of the inventive concept. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when a layer (or film) is referred to as being 'on' another layer (or film) or substrate 100, it can be directly on the other layer (or film) or substrate 100, or intervening layers (or films) may also be present. In the drawings, the dimensions of layers and regions are exaggerated for clarity of illustration. It will be understood that, although the terms first, second, third etc. may be used herein to describe various regions, layers (or films), etc. these regions and layers should not be limited by these terms. These terms are only used to distinguish one region or layer (or film) from another region or layer (film). Thus, a first layer discussed below could be termed a second layer. Example embodiments embodied and described herein may include complementary example embodiments thereof. In the specification, the term 'and/or' is used to specify the inclusion of at least one element listed before and after the term. Like reference numerals refer to like elements throughout.

Hereinafter, embodiments of the inventive concept will be described in detail referring to the attached drawings.

FIG. 1 is a flowchart for explaining a method of fabricating a graphene nano device according to an embodiment of the inventive concept. FIGS. 2A to 9A are plan views for explaining a method of fabricating a graphene nano device according to an embodiment of the inventive concept. FIGS. 2B and 9B are cross-sectional views taken along line I-I' in FIGS. 2A to 9A, respectively. FIGS. 2A to 9A and FIGS. 2B to 9B are not to scale, however are exaggerated for clarity of illustration.

Figure 2A:
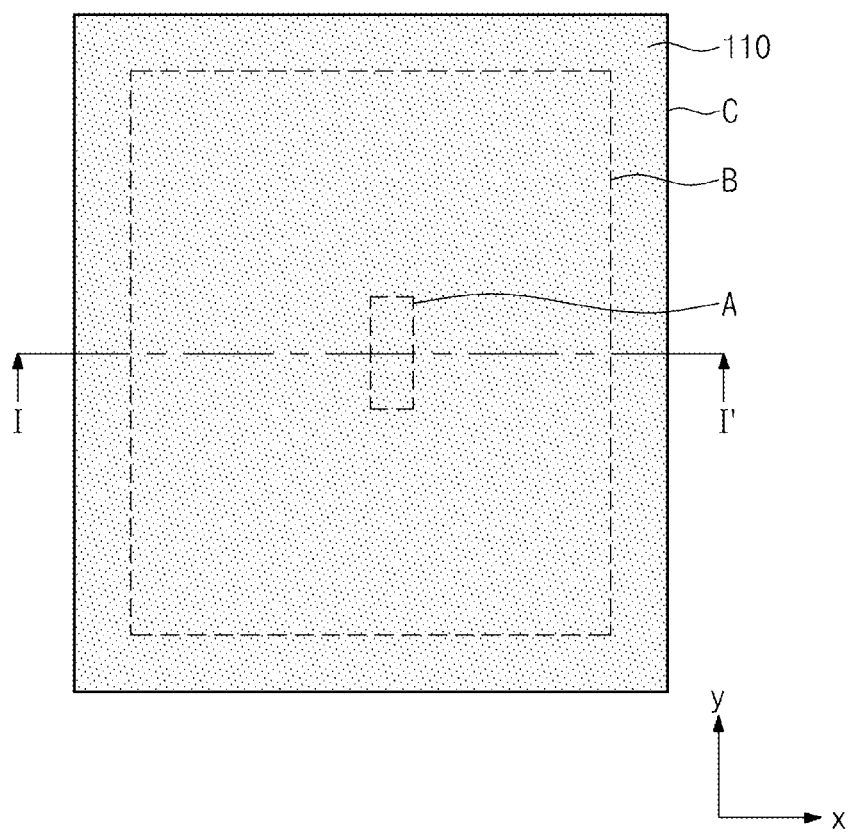
Figure 2B:
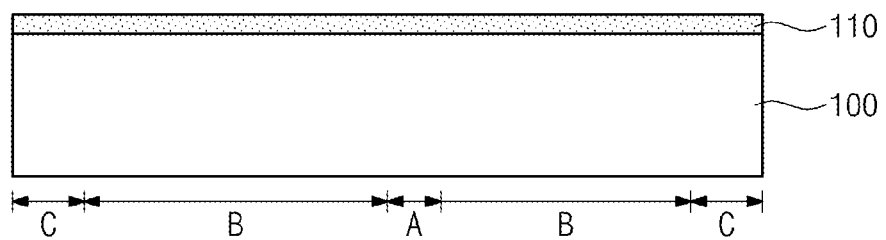
FIGS. 2B and 9B are cross-sectional views taken along line I-I' in FIGS. 2A to 9AB, respectively.

Referring to FIGS. 1, 2A and 2B, a graphene layer 110 may be formed on a substrate 100 (Step S10). The substrate 100 may include a first area A, a third area C and a second area B between the first and third areas A and C. For example, the second area B may surround the first area A, and the third area C may surround the second area B. The substrate 100 may include an insulating material such as glass or plastic, or a semiconductor material including silicon (Si), silicon carbide (SiC) or germanium (Ge).

The graphene layer 110 may be formed to cover the first to third areas A, B and C. The graphene layer 110 may be separately formed and then transferred onto the substrate 100. The graphene layer 110 may be formed by various methods. For example, the graphene layer 110 may be formed by using one method among a chemical vapor deposition method, an ion implantation method, and an epitaxial growth method. However, the inventive concept is not limited thereto. The transfer method may include a widely known wet transfer method or a dry transfer method. For example, the dry transfer method may include an indirect transfer method using a temperature responsive adhesiveness extinction tape or a direct transfer method transferring graphene onto the substrate 100.

Figure 3A:
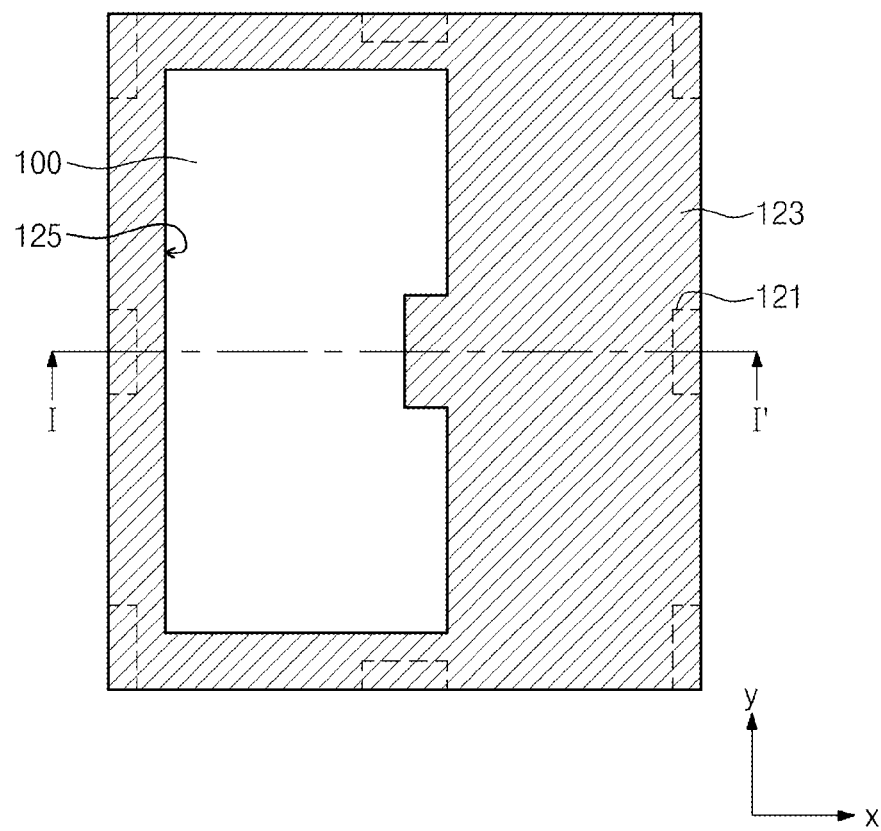
Figure 3B:
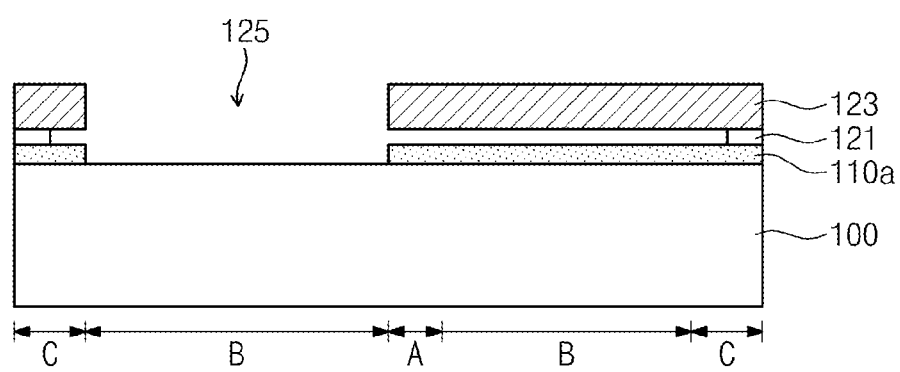

Referring to FIGS. 1, 3A and 3B, a first metal mask pattern 123 may be formed on the substrate 100 on which the graphene layer 110 is formed (Step S20).

In some embodiments, the first mask pattern 123 may be formed by attaching a first metal mask pattern 123 prepared in advance on the graphene layer 110 by a first adhesive layer 121. That is, the first adhesive layer 121 is formed at the edge of the graphene layer 110 (that is, on the graphene layer 110 in the third area C), disposing the separately formed first metal mask pattern 123 on the first adhesive layer 121, and applying heat greater than or equal to a certain temperature to form the first metal mask pattern 123 on the graphene layer 110. In this case, after aligned with respect to the substrate 100 by a photo aligner, the first metal mask pattern 123 may be disposed on the first adhesive layer 121. The first metal mask pattern 123 may include a metal material such as Ti, Cr, Mo, Ta or Al and may be formed by using various methods using metal patterning technique. The first adhesive layer 121 may be formed by coating an adhesive material on the surface of the graphene layer 110. The adhesive material may include various organic materials having adhesiveness. For example, the adhesive material may include a polymer material such as polyimide. The first metal mask pattern 123 may have a first opening 125 exposing a portion of the graphene layer 110 in the second area B. That is, the first metal mask pattern 123 formed on the substrate 100 may cover the graphene layer 110 in the first area A and the third area C while exposing a portion of the graphene layer 110 in the second area B.

After forming the first mask pattern 123 on the substrate 100, a first etching process using the first metal mask pattern 123 as an etching mask may be performed (Step S30). The first etching process may include an anisotropic dry etching process. For example, the first etching process may be performed by using an oxygen ($O_2$) or argon (Ar) plasma apparatus or an inductively coupled plasma (ICP) apparatus. Through the first etching process, the graphene layer 110 in the second area B exposed by the first opening 125 may be removed to form a preliminary graphene pattern 110a. Then, the first adhesive layer 121 may be removed, and the first metal mask pattern 123 may be separated from the substrate 100. The first adhesive layer 121 may be removed by dissolving the first adhesive layer 121 using an organic solvent such as acetone.

Figure 4A:
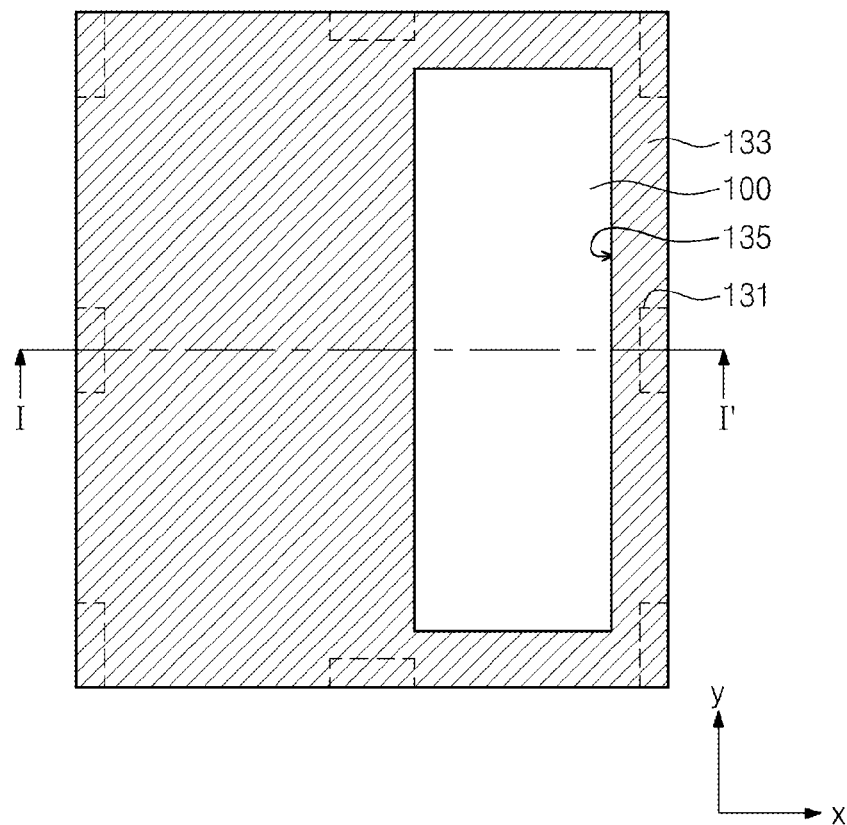
Figure 4B:
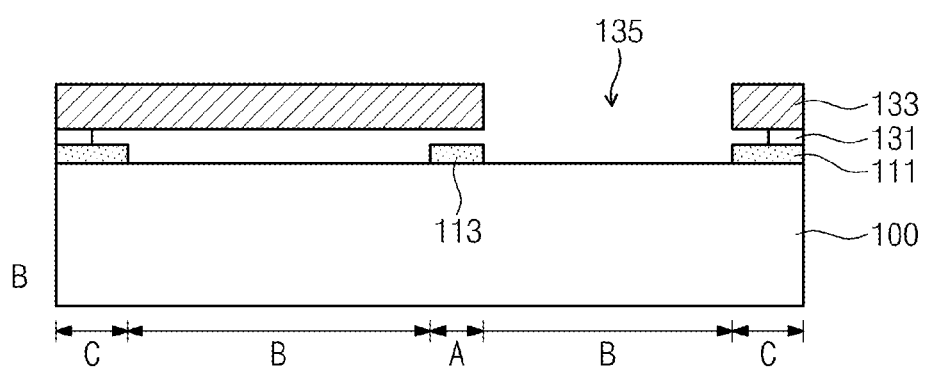

Referring to FIGS. 1, 4A and 4B, a second metal mask pattern 133 having a second opening 135 may be formed on the substrate 100 on which the preliminary graphene pattern 110a is formed (Step S20). The second metal mask pattern 133 may be formed by attaching a separately formed second metal mask pattern 133 on the substrate 100 by a second adhesive layer 131 formed on the preliminary graphene pattern 110a as explained in FIGS. 1, 3A and 3B. The second metal mask pattern 133 and the second adhesive layer 131 may include the same materials as those of the first metal mask pattern 123 and the first adhesive layer 121, respectively. The second metal mask pattern 133 may expose the preliminary graphene pattern 110a (see FIGS. 3A and 3B) in the second area B remained after performing the first etching process.

After forming the second metal mask pattern 133 on the substrate 100, a second etching process using the second metal mask pattern 133 as an etching mask may be performed (Step S30). The second etching process may include the same method as the above-described first etching process. After the second etching process, the preliminary graphene pattern 110a (see FIGS. 3A and 3B) in the second area B exposed by the second opening 135 may be removed. As a result, unnecessary part of the graphene layer (graphene layer 110 in the second area B, see FIGS. 2A and 2B) may be entirely removed by the first and second etching processes. Accordingly, a first graphene pattern 111 may be formed in the third area C and a second graphene pattern 113 may be formed in the first area A.

Figure 5A:
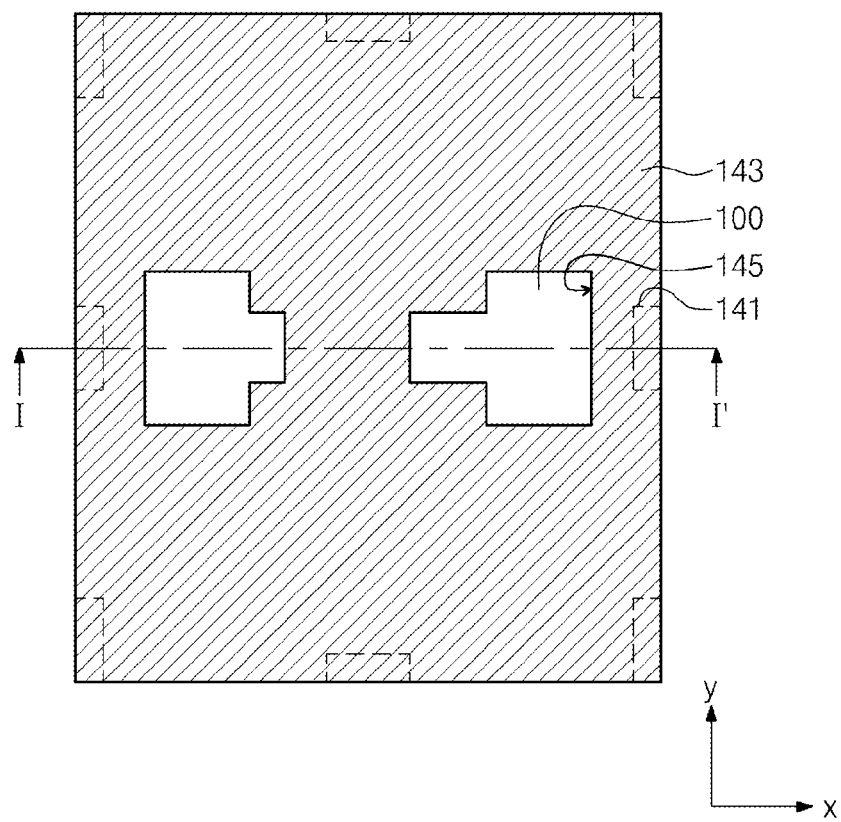
Figure 5B:
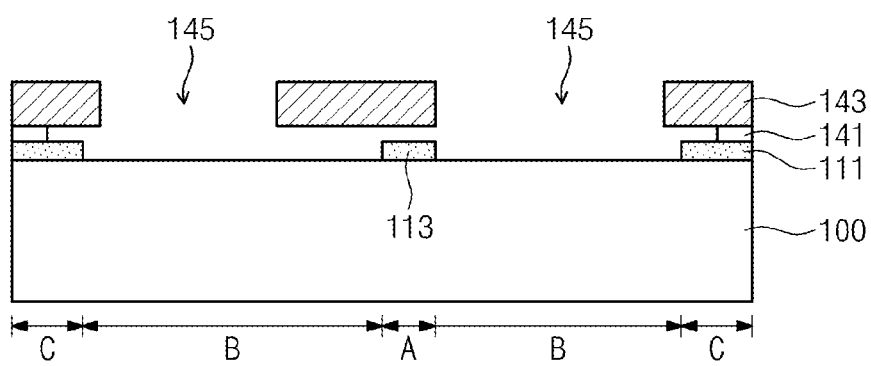

Referring to FIGS. 5A and 5B, after separating the second metal mask pattern 133 (see FIGS. 4A and 4B) from the substrate 100, a third metal mask pattern 143 may be formed on the substrate 100 on which the first and second graphene patterns 111 and 113 are formed. The third metal mask pattern 143 may be formed by attaching a separately formed third metal mask pattern 143 on the substrate 100 by a third adhesive layer 141 formed on the first graphene pattern 111, like the first and second metal mask patterns 123 and 133. The third metal mask pattern 143 and the third adhesive layer 141 may include the same materials as those of the first metal mask pattern 123 and the first adhesive layer 121, respectively. The third metal mask pattern 143 may have a third opening 145 exposing a portion of the second area B of the substrate 100.

Figure 6A:
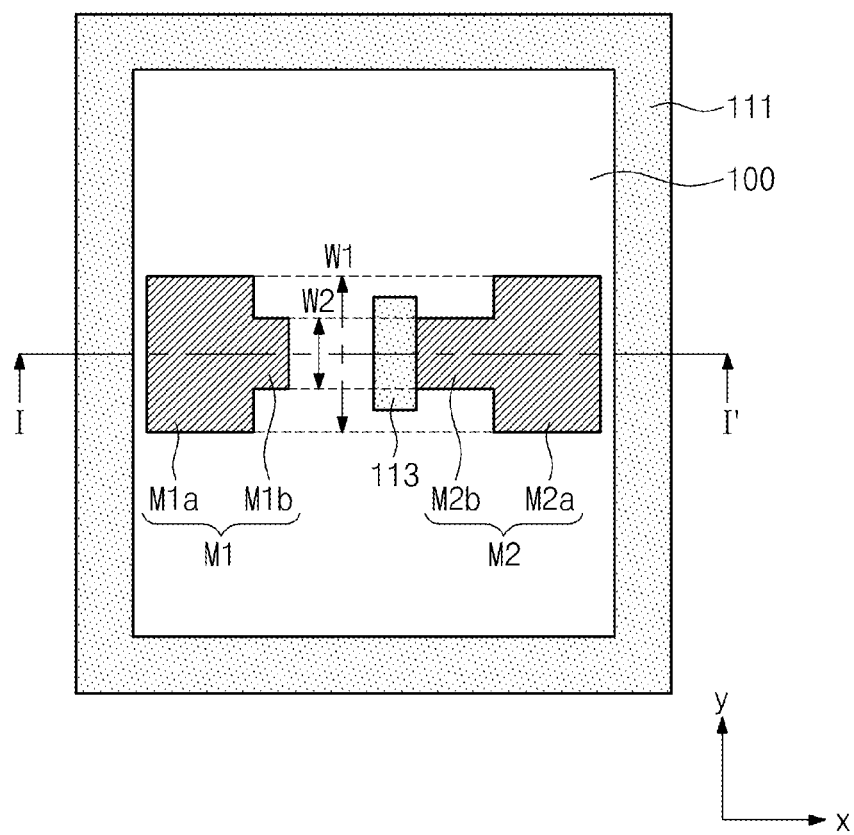
Figure 6B:
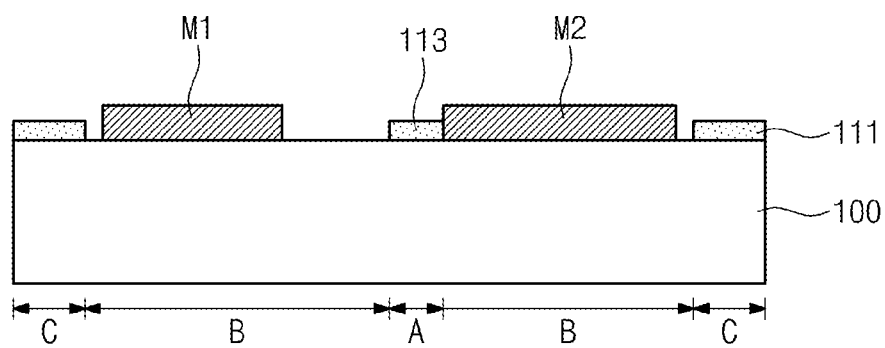

Referring to FIGS. 6A and 6B, first and second metal electrode patterns M1 and M2 may be formed in the second area B of the substrate 100. In some embodiments, the first and second metal electrode patterns M1 and M2 may be formed by depositing a metal layer on the entire surface of the product in FIGS. 5A and 5B and separating the third metal mask patterns 143 from the substrate 100. The metal layer may include at least one among Ti, Au, Ni and Pt. The metal layer may be formed by a physical vapor deposition (PVD) process. For example, the metal layer may be formed by using a thermal evaporator, an e-beam evaporator or a sputter apparatus. The third metal mask pattern 143 may be separated from the substrate 100 by removing the third adhesive layer 141 using an organic solvent such as acetone.

The first and second metal electrode patterns M1 and M2 may be formed to have substantially the same shape as the third opening 145 (see FIGS. 5A and 5B) of the third metal mask pattern 143 (see FIGS. 5A and 5B) from a planar view. In detail, the first metal electrode pattern M1 may be spaced apart from the second graphene pattern 113 in the opposite direction to an x-direction. The first metal electrode pattern M1 may include a first part M1a having a first width W1 and a second part M1b having a second width W2 smaller than the first width W1. The second part M1b of the first metal electrode pattern M1 may be extended from the first part M1a in the x-direction. Similarly, the second metal electrode pattern M2 may include a first part M2a having a first width W1 and a second part M2b having a second width W2 smaller than the first width W1. The second part M2b of the second metal electrode pattern M2 may be extended from the first part M2a in the opposite direction to the x-direction and may make contact with one side of the second graphene pattern 113. The width W1 of first part M1a of the first metal electrode pattern M1 and that of the first part M2a of the second metal electrode pattern M2 are shown the same, however may be different in another embodiment. Similarly, the width W2 of the second part M1b of the first metal electrode pattern M1 and that of the second part M2b of the second metal pattern M2 are shown the same, however may be different in another embodiment. In the graphene nano device according to an embodiment of the inventive concept, the binding force of the metal electrode patterns M1 and M2 with the substrate 100 may be increased by removing the graphene layer 110 (see FIGS. 2A and 2B) in the second area B and forming the metal electrode patterns M1 and M2 on the substrate 100 in the second area B.

Figure 7A:
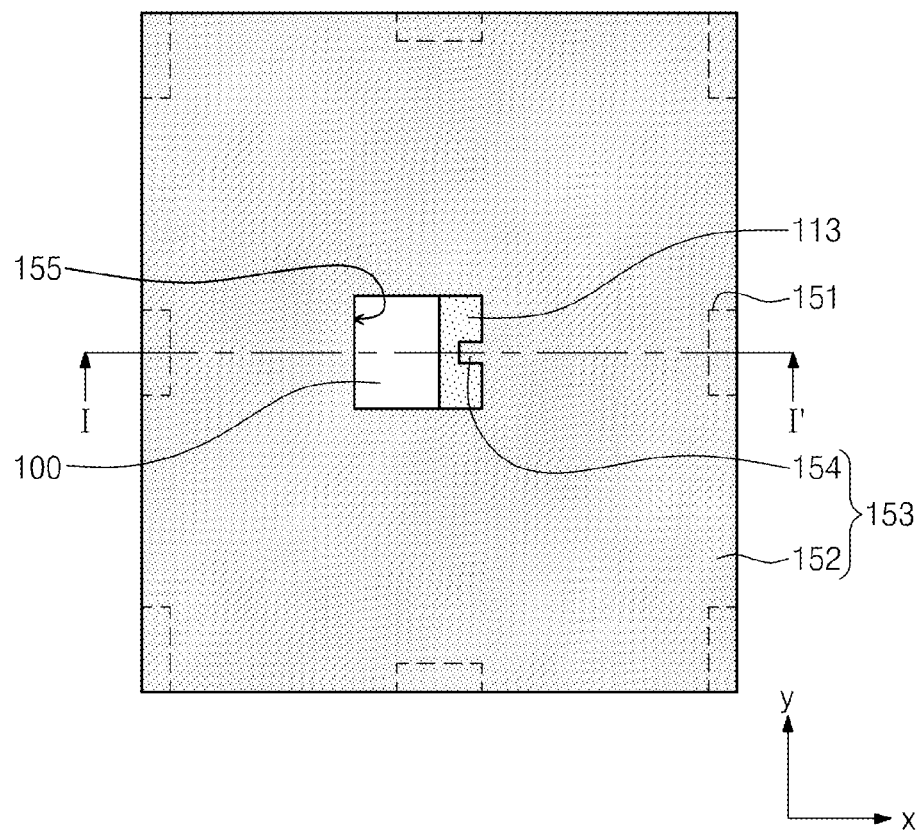
Figure 7B:
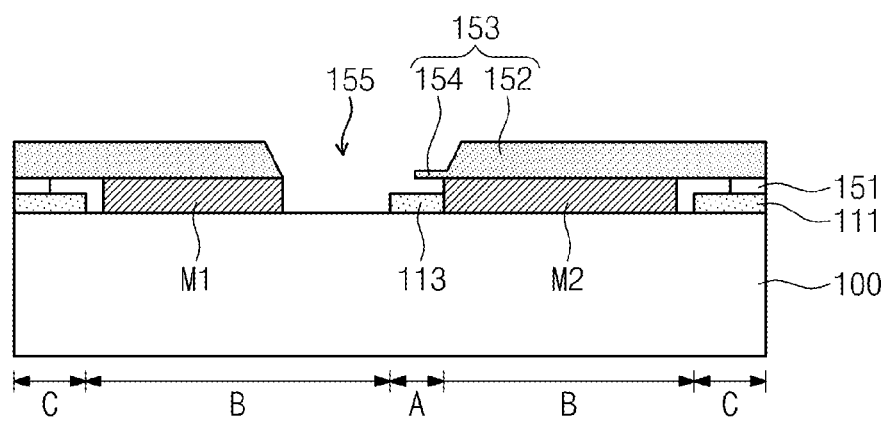

Referring to FIGS. 1, 7A and 7B, a first membrane mask pattern 153 may be formed on the substrate on which the first and second metal electrode patterns M1 and M2 are formed (Step S40).

In some embodiments, the first membrane mask pattern 153 may be formed by attaching a separately formed first membrane mask pattern 153 on the substrate 100 by a fourth adhesive layer 151 formed on the first graphene pattern 111. The first membrane mask pattern 153 may include at least one among a silicon oxide layer, a silicon nitride layer and a silicon oxynitride layer, and may be formed by using various methods using insulation layer patterning technique.

In an embodiment, the first membrane mask pattern 153 may have a fourth opening 155 defined by the inner wall of the first membrane mask pattern 153 and exposing a portion of the second graphene pattern 113. In detail, the first membrane mask pattern 153 may include a body part 152 and a membrane part 154 extended from the inner wall of the body part 152 in the opposite direction to the x-direction and covering a portion of the second graphene pattern 113. The inner wall of the body part 152 and the outer wall of the membrane part 154 may define the fourth opening 155. Thus, at least a portion of the fourth opening 155 may be defined by the side wall of the membrane part 154. The thickness of the membrane part 154 may be smaller than the thickness of the body part 152. That is, the membrane part 154 is formed as a thin film, and plays the role of a mask for nano level micro patterning. The fourth adhesive layer 151 may include the same material as the first adhesive layer 121 and may be formed by the same method.

After forming the first membrane mask pattern 153, a third etching process using the first membrane mask pattern 153 as an etching mask may be performed (Step S50). The third etching process may include the same method as the above-described first etching process. After performing the third etching process, a portion of the second graphene pattern 113 exposed by the fourth opening 155 may be removed, and a micro graphene pattern G (see FIGS. 8A and 8B) may be formed. Then, the adhesive layer 151 may be removed, and the first membrane mask pattern 153 may be separated from the substrate 100.

Figure 8A:
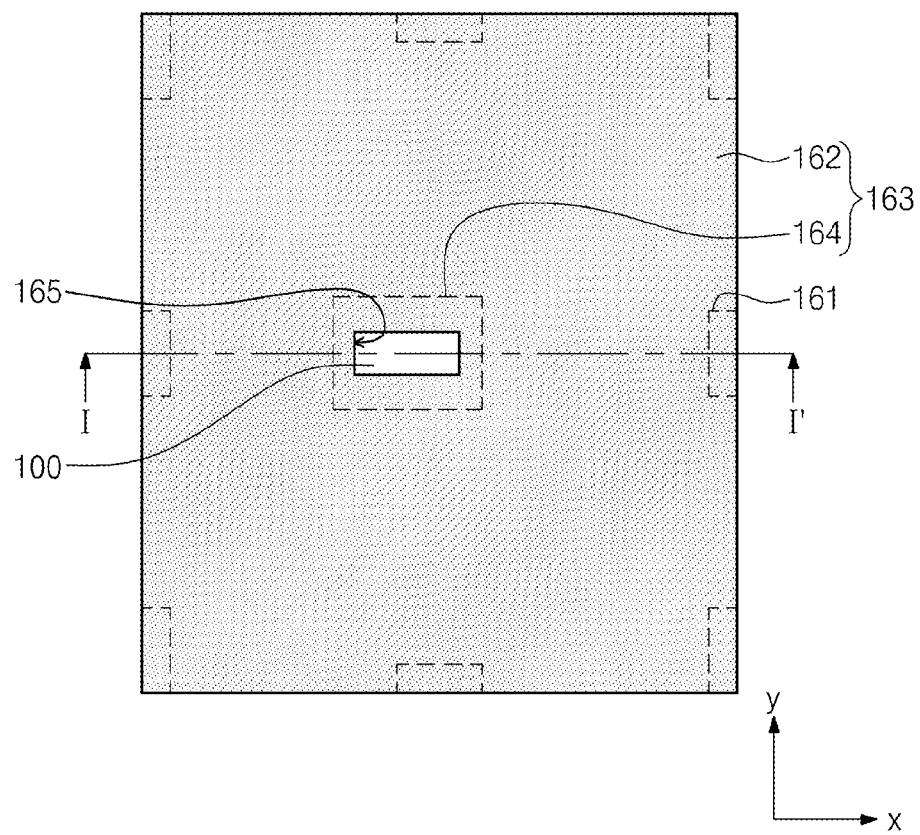
Figure 8B:
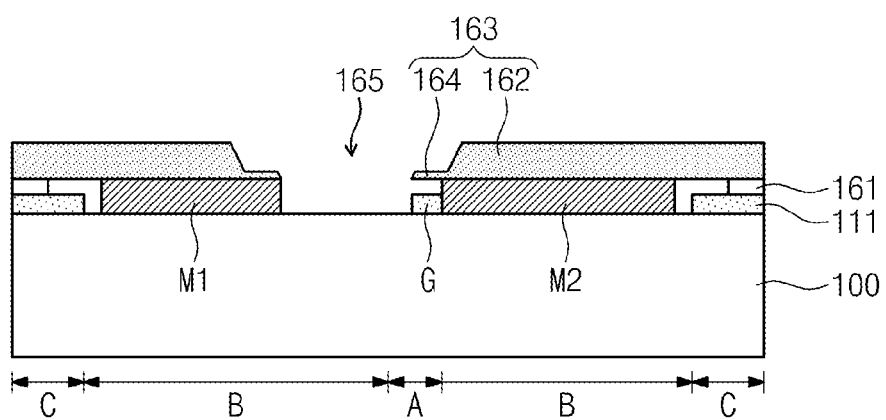

Referring to FIGS. 8A and 8B, a second membrane mask pattern 163 may be formed on the product including the micro graphene pattern G.

In some embodiments, the second membrane mask pattern 163 may be formed by attaching a separately formed second membrane mask pattern 163 on the substrate 100 by a fifth adhesive layer 161 formed on the first graphene pattern 111 as described in FIGS. 1, 7A and 7B. The second membrane mask pattern 163 and the fifth adhesive layer 161 may include the same materials as the first membrane mask pattern 153 and the fourth adhesive layer 151, respectively.

According to an embodiment of the inventive concept, the second membrane mask pattern 163 may have a fifth opening 165 defined by the inner wall of the second membrane mask pattern 163 and exposing the substrate 100. In detail, the second membrane mask pattern 163 may include a body part 162 and a membrane part 164 extended from the body part 162 in the direction of the fifth opening 165. The inner wall of the body part 162 and the outer wall of the membrane part 164 may define the fifth opening 165. Accordingly, at least a portion of the fifth opening 165 may be defined by the side wall of the membrane part 164. The upper width of the fifth opening 165 may be smaller than the lower width thereof. The thickness of the membrane part 164 may be smaller than the thickness of the body part 162. That is, the membrane part 164 is formed as a thin film and plays the role of a mask for nano level micro patterning.

Figure 9A:
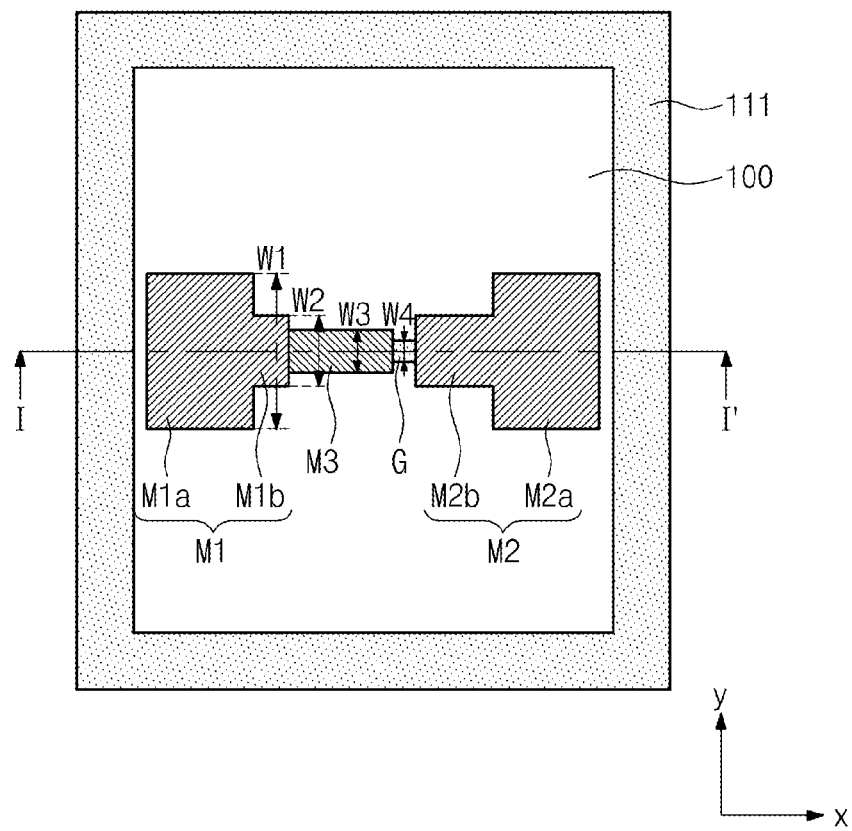
Figure 9B:
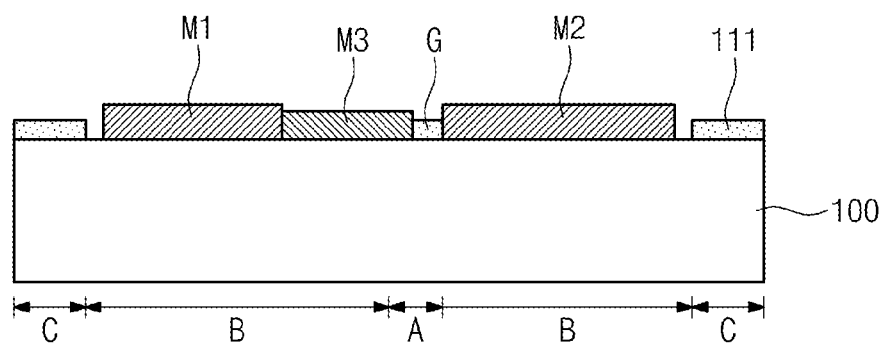

Referring to FIGS. 9A and 9B, a micro metal electrode pattern M3 may be formed on the substrate 100 exposed by the fifth opening 165 (see FIGS. 8A and 8B). In some embodiments, the micro metal electrode pattern M3 may be formed by depositing a metal layer on the structure of FIGS. 8A and 8B and separating the second membrane mask pattern 163 from the substrate 100. The metal layer may include at least one among Ti, Au, Ni and Pt. The metal layer may be formed by a PVD process. For example, the metal layer may be formed by using a thermal evaporator, an e-beam evaporator or a sputter apparatus. The second membrane mask pattern 163 may be separated from the substrate 100 by removing the fifth adhesive layer 161 using an organic solvent such as acetone.

The micro metal electrode pattern M3 may be formed to have substantially the same shape as the fifth opening 165 (see FIGS. 8A and 8B) of the second membrane mask pattern 163 (see FIGS. 8A and 8B) from a planar view. For example, the micro metal electrode pattern M3 may be formed to have a width W3 of a certain size. One side of the micro metal electrode pattern m3 may make a contact with the first metal electrode pattern M1, and facing the other side may make a contact with the micro graphene pattern G. The width W3 of the micro metal electrode pattern M3 may be smaller than the second width W2 of the first and second metal electrode patterns M1 and M2 and may be greater than the width W4 of the micro graphene pattern G. Here, the metal electrode patterns M1 and M2 and the micro metal electrode pattern M3 may constitute an electrode of a graphene nano device according to an embodiment of the inventive concept, and the micro graphene pattern G may constitute a channel of a graphene nano device according to an embodiment of the inventive concept.

According to an embodiment of the inventive concept, the contamination of the surface of a graphene pattern may be decreased by forming the graphene pattern by forming a metal mask pattern prepared in advance on a substrate including a graphene layer formed thereon and performing an etching process using the metal mask pattern as an etching mask when compared to a method using a photoresist mask pattern. In addition, more accurate micro graphene pattern may be formed by performing a patterning process using a membrane mask pattern formed by using a nitride layer. Thus, a graphene nano device having improved electrical properties may be provided.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of fabricating a graphene nano device, comprising:
    forming a first metal mask pattern on a substrate on which a graphene layer is formed; and
    forming a graphene pattern by performing an etching process on the graphene layer using the first metal mask pattern as an etching mask,
    wherein the forming of the first metal mask pattern comprises:
    forming a first adhesive layer on the graphene layer;
    disposing the first metal mask pattern prepared in advance on the first adhesive layer; and
    heating the first adhesive layer to attach the first metal mask pattern on the substrate.

2. The method of fabricating a graphene nano device of claim 1, further comprising:
    forming a first membrane mask pattern on the graphene pattern; and
    performing an etching process on the grapheme pattern using the first membrane mask pattern as an etching mask to form a micro graphene pattern.

3. The method of fabricating a graphene nano device of claim 2, wherein the forming of the first membrane mask pattern comprises:
    forming a second adhesive layer on the graphene pattern;
    disposing the first membrane mask pattern prepared in advance on the second adhesive layer; and
    heating the second adhesive layer to attach the first membrane mask pattern on the substrate.

4. The method of fabricating a graphene nano device of claim 2, wherein the first membrane mask pattern comprises a first opening defined by an inner wall of the first membrane mask pattern, and the first opening exposes a portion of the graphene pattern.

5. The method of fabricating a graphene nano device of claim 4, wherein the first membrane mask pattern comprises a body part and a membrane part extended from an inner wall of the body part, and at least a portion of the first opening is defined by a side wall of the membrane part.

6. The method of fabricating a graphene nano device of claim 5, wherein a thickness of the membrane part is smaller than a thickness of the body part.

7. The method of fabricating a graphene nano device of claim 2, wherein the first membrane mask pattern comprises at least one of a silicon oxide layer, a silicon nitride layer and a silicon oxynitride layer.

8. The method of fabricating a graphene nano device of claim 1, wherein a portion of the substrate is exposed by the etching process,
    the method further comprising forming a metal electrode pattern on the exposed substrate,
    wherein the forming of the metal mask pattern on the substrate comprises:
    forming a second metal mask pattern on the substrate;
    depositing a metal layer on the substrate on which the second metal mask pattern is formed; and
    removing the second metal mask pattern after depositing the metal layer.

9. The method of fabricating a graphene nano device of claim 8, wherein the forming of the second metal mask pattern comprises:
    forming a third adhesive layer on the graphene pattern;
    disposing the second metal mask pattern prepared in advance on the third adhesive layer; and
    heating the third adhesive layer to attach the second metal mask pattern on the substrate.

10. The method of fabricating a graphene nano device of claim 1, wherein a portion of the substrate is exposed by the etching process,
    the method further comprising forming a micro metal electrode pattern on the exposed substrate, wherein the forming of the micro metal electrode pattern comprises:

forming a second membrane mask pattern on the substrate;

depositing a metal layer on the substrate on which the second membrane mask pattern is formed; and removing the second membrane mask pattern after depositing the metal layer.

11. The method of fabricating a graphene nano device of claim 1, further comprising separating the first metal mask pattern from the substrate after forming the graphene pattern, wherein the first metal mask pattern is separated from the substrate by removing the first adhesive layer using an organic solvent.

* * * * *